United States Patent [19]
Tomimatu

[11] Patent Number: 6,165,656
[45] Date of Patent: Dec. 26, 2000

[54] OVERLAY ERROR DETERMINATION MARK CONSIDERING INFLUENCE OF ABERRATION

[75] Inventor: Yoshikatu Tomimatu, Hyogo, Japan

[73] Assignee: Mitsubishi Denki Kabushiki Kaisha, Tokyo, Japan

[21] Appl. No.: 09/293,783

[22] Filed: Apr. 20, 1999

Related U.S. Application Data

[62] Division of application No. 08/780,265, Jan. 8, 1997, Pat. No. 5,939,226.

[30] Foreign Application Priority Data

Mar. 8, 1996 [JP] Japan .................... 8-051542

[51] Int. Cl.[7] ...................................... G03F 9/00
[52] U.S. Cl. ..................... 430/22; 257/797; 438/401; 438/975
[58] Field of Search .................. 430/5, 22; 257/797; 438/401, 975

[56] References Cited

PUBLICATIONS

Young–Hong Min et al., "Effective Alignment Techniques and its Implementation to Enhance Total Overlay Accuracy on Highly Reflective Films", *SPIE*, vol. 2439, pp. 287–297.

Souichi Katagiri et al., "Overlay Error Estimation of Water Rear Surface Alignment for 0.1μm Lithography", *Jpn. J. Appln. Phys.*, vol. 32, pp. 6039–6043.

C.S. Lee et al., "Overlay and Lens Distortion in a Modified Illumination Stepper", *SPIE*, vol. 2197, pp. 2–8.

Pei–yang Yan et al., "Effect of Lens Aberration on Oblique Illumination Stepper System", *SPIE*, vol. 1927, Optical/Laser Microlithography VI (1993), pp. 167–180.

Nigel R. Farrar, "Effect of Off–Axis Illumination on Stepper Overlay", *SPIE*, vol. 2439, pp. 273–280.

*Primary Examiner*—Christopher G. Young
*Attorney, Agent, or Firm*—McDermott, Will & Emery

[57] ABSTRACT

An aberration estimation reticle is provided with a plurality of units spaced from each other. The unit is provided with a first determination mark having a square planar configuration, and a second determination mark located in the first determination mark and including a plurality of holes arranged along a square. These structures provide an overlay error determination reticle and a method of determining an overlay error with the reticle taking an influence by aberration into consideration.

1 Claim, 17 Drawing Sheets

OVERLAY ERROR DETERMINATION MARK CONSIDERING INFLUENCE OF ABERRATION

This application is a divisional of application Ser. No. 08/780,265 filed Jan. 8, 1997 U.S. Pat. No. 5,939,226.

BACKGROUND OF THE INVENTION

1. Field of the Invention

The present invention relates to a light exposure technology, and in particular to a reticle for determining an overlay error taking an influence by aberration into consideration, a method of determining an overlay error with the reticle, and a mark for determining an overlay error.

2. Description of the Background Art

In recent years, a semiconductor device is formed of a plurality of layers, and it has been tried to reduce sizes of elements forming the semiconductor device. In view of this, an overlay error of elements formed at respective layers of the semiconductor device is of increasing importance. As the sizes of elements have been reduced, it is now impossible to ignore an influence on light exposure by aberration in an optical system.

The overlay error can be classified into the following types.

(1) Overlay error: overlay error in general meaning.

(2) Alignment error: alignment errors in X, Y and θ at a chip after alignment.

(3) Stability and relative error of a device: an error caused by an aligner itself.

(4) Mask error: pattern location error from an ideal point of a mask angular coordinate point.

(5) Error by thermal expansion of a mask: overlay error caused by thermal expansion of a mask in an aligner.

(6) Other errors: errors such as an error caused by bending during fixing of a mask and a wafer, and non-linear distortion caused by high-temperature processing of a wafer.

As described above, overlay errors are caused by various factors, but the overlay error of the above item (1) will be described below.

An overlay error determination mark used for determining the overlay error will now be described below in connection with an MOS (Metal Oxide Semiconductor) transistor forming a memory cell of a DRAM (Dynamic Random Access Memory).

FIG. 15 is a cross section schematically showing a general structure of an MOS transistor. FIG. 16 is a plan schematically showing a structure of a semiconductor device including the MOS transistor in FIG. 15.

Referring to FIG. 15, an MOS transistor has a pair of source/drain regions 7, a gate insulating layer 2 and a gate electrode layer 6. Paired source/drain regions 7 are formed at a surface of a semiconductor substrate 1 with a space between each other. Gate electrode layer 6 is formed at a region between paired source/drain regions 7 with gate insulating layer 2 therebetween.

Gate electrode layer 6 is covered with an interlayer insulating layer 3. A contact hole 3a reaching a portion of a surface of the source/drain region is formed at interlayer insulating layer 3 and gate electrode layer 2. There is formed a bit line 5 which is electrically connected to source/drain region 7 through contact hole 3a.

Referring mainly to FIG. 16, each gate electrode layer 6 in the DRAM is integral with the word line and extends in a direction Y in the figure. Each bit line 5 extends perpendicularly to word line 6, i.e., in a direction X in the figure.

It is now assumed that word lines 6 and bit lines 5 each have a width of 0.4 μm, and are spaced from each other by a space of 1 μm.

In the DRAM, a storage node (lower electrode) is connected to source/drain region 7 of the MOS transistor through a contact hole 10. Generally, contact hole 10 is formed at a region 10A defined between word lines 6 and bit lines 5. It is assumed that contact hole 10 has an opening of 0.5 μm by 0.5 μm. If respective members 5, 6 and 10 are formed and overlaid accurately in accordance with a design, a distance X in the direction X between word line 6 and contact hole 10 equals to 0.25 μm, and a distance Y in the direction Y between bit line 5 and contact hole 10 also equals to 0.25 μm.

However, contact hole 10 may be opened at a shifted position as shown by alternate long and short dash line in the figure due to an overlay error. In this case, word line 6 or bit line 5 may be exposed through a side wall of contact hole 10. This results in such a disadvantage that, when the storage node is formed along the inner wall of contact hole 10, the storage node is short-circuited to word line 6 or bit line 5.

Contact hole 10 is formed in the following process. As shown in FIG. 15, a resist film 9 formed on an interlayer insulating layer 8 is patterned to have a contact hole pattern by a photolithography, and etching is performed to form contact hole 10 using patterned resist film 9 as a mask.

Therefore, in the stage that the patterning of resist film 9 is completed, processing is performed to determine a positional shift between the position of the contact hole pattern formed at resist film 9 and the position of word line 6 or bit line 5. If it is determined that the contact hole pattern is not precisely located in resist film 9, it is required only to form resist film 9 again.

However, contact hole 10 and word line 6 are spaced only by a very small space of 0.25 μm, and also contact hole 10 and bit line 5 are spaced only by a very small space of 0.25 μm. Therefore, it is difficult to determine an overlay error at these regions.

Accordingly, an overlay error determination mark is used as a dummy pattern for determining the overlay error. The overlay error determination mark is formed at a peripheral region, where a semiconductor device is to be formed, simultaneously with formation of the word line, bit line and resist film. The overlay error of the contact hole pattern at the resist film with respect to the word line and bit line can be determined by determining the overlay error of the overlay error determination mark.

Now, the overlay error determination mark will be described below.

FIG. 17 is a schematic cross section showing arrangement of an overlay error determination mark. Referring to FIG. 17, a first determination mark 301 located at a peripheral region of the semiconductor device is formed at a predetermined position on gate insulating layer 2 simultaneously with processing of forming word line 6. Thus, first determination mark 301 is formed from the same layer as word line 6. First determination mark 301 has a substantially square planar form of 25 μm by 25 μm.

Simultaneously with formation of bit line 5, a second determination mark 302 is formed at a predetermined position on interlayer insulating layer 3. Thus, second determination mark 302 is formed from the same layer as bit line 5. Similarly to first determination mark 301, second determination mark 302 has a substantially square planar form of 25 μm by 25 μm.

Simultaneously with the patterning of resist film 9, third and fourth determination marks 303a and 303b are formed on interlayer insulating layer 8 and thus are located above first and second determination marks 301 and 302, respectively. Each of third and fourth determination marks 303a and 303b has a square planar form of 15 μm by 15 μm.

The overlay error determination mark thus constructed is of a so-called a Box-in-Box type. Each of first, second, third and fourth determination marks 301, 302, 303a and 303b has a square planar form as described above, because this is required by an overlay inspecting device (e.g., KLA5011 manufactured by KLA corp.). This overlay inspecting device is designed to recognize positions of sides of squares. It is also required that each side of first and second determination marks 301 and 302 has a length of 15 to 30 μm, and that each side of third and fourth determination marks 303a and 303b has a length of 7.5 to 15 μm. According to the current technology, it is impossible to inspect overlay error with sizes smaller than the above values.

Then, a method of determining a pattern overlay error will be described below in connection with the above first and third determination marks.

FIG. 18A is a plan showing an overlay error determination mark of the Box-in-Box type which is formed of the first and third determination marks. FIG. 18B is a schematic cross section taken along line 18B—18B in FIG. 18A, and FIG. 18C shows light and shade of a detection signal taken along line 18B—18B in FIG. 18A.

Referring to FIGS. 18A, 18B and 18C, the detection signal represents darkness peaks at side walls 311a, 311b, 312a and 312b of first and third determination marks 301 and 303a. The positions of side walls of first and third determination marks 301 and 303a can be determined based on the light and shade represented by the detection signal. Based on the positions of the respective side walls, it is possible to determine the overlay error between the bit line and the contact hole pattern at the resist film, as will be described later.

FIG. 19 is a plan showing arrangement of the first and third determination marks including an overlay error.

Referring to 19, determination of the overlay error is conducted as follows. First, a distance a between side walls 311a and 312a and a distance b between side walls 311b and 312b are derived from determined positions of the side walls of respective marks 301 and 303a. A shift quantity or length between second and fourth determination marks 302 and 303b is calculated from distances a and b. More specifically, the shift quantity is calculated from a formula of (a−b)/2. The shift quantity between first and third determination marks 301 and 303a corresponds in one-to-one relationship to a shift quantity between word line 6 and the contact hole pattern at resist film 9, and can be considered directly as the overlay error.

The shift quantity between second and fourth determination marks 302 and 303b can be determined in a similar manner.

In connection with FIGS. 18A, 18B, 18C and FIG. 19, description has been given on a structure in which both of first and third determination marks 301 and 303a are formed of solid or remained patterns. However, an overlay error can be similarly determined even in a structure wherein both of first and third determination marks 301 and 303a are formed of hollow or removed patterns as shown in FIGS. 20A, 20B and 20C.

In accordance with reduction of sizes of patterns in a semiconductor device, however, such a situation begins that aberration exerts a remarkable influence on determination of overlay error described above. An influence by aberration causes such a problem that the shift quantity determined from the overlay error determination mark does not correspond in one-to-one relationship to the actual shift quantity between the word line (or bit line) and the contact hole.

Aberration will now be briefly described below.

Ideal imaging in an optical system requires the followings:

(a) Light beams point-symmetrically emitted from an object point are joined point-symmetrically at an image point.

(b) A planar object forms a planar image.

(c) A lateral magnification is constant throughout an image plane.

The above conditions are required to be satisfied for monochromatic light, but are also desired to be satisfied for polychromatic light (white light). Shift or deviation from this ideal imaging conditions is called the aberration.

Aberration caused by a situation departing from the condition of the item (a) is called spherical aberration, astigmatism or coma aberration.

Aberration caused by a situation departing from the condition of the item (b) is called field curvature aberration.

Aberration caused by a situation departing from the condition of the item (c) is called curvature aberration.

Here, description will be given on the coma aberration, which exerts the largest influence on the determination of overlay error related to the invention.

FIG. 21A shows a sectional structure of a reticle, FIG. 21B shows a distribution of light intensity of exposure light passed through the reticle, and FIG. 21C shows a resist film patterned by the exposure light.

Referring to FIGS. 21A and 21B, a reticle 405a has a transparent substrate 401 and a shade film 402a. A region on transparent substrate 401 covered with shade film 402a forms a light intercepting region, and a region not covered with shade film 402a forms a light transmitting region. Shade film 402a forms a removed pattern 403a on transparent substrate 401 of reticle 405a.

Exposure light 450 irradiated toward reticle 405a would have a light intensity on resist film 422a as represented by solid line 411a, if no influence were exerted. However, due to the influence by coma aberration, the light intensity remarkably shifts only in one direction, and only a right-hand portion of solid line 411a exhibits a light intensity as shown in dotted line 412a.

Consequently, as shown in FIG. 21C, a hole pattern of a size L2 is formed at resist film 422a, at which a hole pattern of a size L1 (L2>L1) would be formed.

The influence by coma aberration is exerted not only on removed pattern 403a of the reticle shown in FIG. 21A but also on a remained pattern 403b of the reticle shown in FIGS. 22A, 22B and 22C. This will be described below.

FIG. 22A shows a sectional structure of the reticle, FIG. 22B shows a distribution of light intensity of exposure light passed through the reticle, and FIG. 22C shows a resist film patterned by the exposure light.

Referring to FIGS. 22A and 22B, a shade film 402b forming a remained pattern 403b is formed on transparent substrate 401 of a reticle 405b. Exposure light 450 passed through reticle 405b would have a light intensity on resist film 422b as represented by solid line 411b, if no influence were exerted. However, due to the influence by coma aberration, the light intensity shifts only in one direction, and only a left-hand portion of solid line 411b exhibits a light intensity as shown in dotted line 412b.

Consequently, as shown in FIG. 22C, a pattern of a size L4 remains at resist film 422b, at which a pattern of a size L3 should remain.

As shown in FIGS. 21A, 21B and 21C as well as FIGS. 22A, 22B and 22C, coma aberration exerts an influence on either of the remained and removed patterns in reticles. The influence by coma aberration increases as the size of pattern decreases. Thus, a shift quantity due to coma aberration increases as the size of pattern decreases. This will be described below.

Shift of a wave front caused by coma aberration is large at a peripheral portion of a lens and is small at a central portion. From results of analysis by experiments and simulations, it has been known that diffracted rays of a large pattern are not significantly affected by coma aberration because they have a small diffraction angle and pass through a central region of a pupil causing less wave front aberration, so that misregistration is suppressed.

Meanwhile, a small pattern allows passage of high-frequency light to a larger extent than a large pattern. High-frequency light is liable to be affected by a diffraction phenomenon of a lens. Therefore, the rays diffracted by a small pattern have a large diffraction angle, and pass through a peripheral region of a pupil causing a large wave front aberration, so that coma aberration exerts a large influence on them, and significant misregistration of the pattern occurs.

More specific description will now be given with reference to FIGS. 23A, 23B and 23C.

Referring to FIGS. 23A, 23B and 23C, a reticle 405d has a removed pattern (light transmitting portion) $403d_1$ forming a large pattern and a removed pattern (light transmitting portion) $403d_2$ forming a small pattern. Exposure light 450 passed through reticle 405d would have a light intensity on resist film 422d as represented by solid lines 411a and 411b, if no influence were exerted. However, due to the influence by coma aberration, the light intensity shifts only in one direction, and only left-hand portions of solid lines 411a and 411b exhibit light intensities as shown in dotted lines 412a and 412b.

As already described, a smaller pattern causes a larger influence by coma aberration, so that the small pattern causes a larger shift quantity along one direction in the light intensity than the large pattern.

Consequently, as shown in FIG. 23C, the shift quantity (L8–L7) of hole pattern (small pattern) $422d_2$ at resist film 422d is larger than the shift quantity (L10–L9) of hole pattern (large pattern) $422d_1$.

Although the sizes of first and third determination marks 301 and 303a forming the conventional overlay error determination mark shown in FIG. 18 are restricted due to restriction of a measuring device, patterns (word line, bit line, contact hole and others) in the semiconductor device have been and will be miniaturized to a higher extent. Therefore, it can be considered that the overlay error determination mark corresponds to the large pattern described above, and the pattern in the semiconductor device corresponds to the small pattern.

Therefore, even if the overlay error is determined, the influence exerted by coma aberration at the overlay error determination mark differs from the influence exerted by coma aberration at the pattern in the semiconductor device. Accordingly, one-to-one relationship does not exist between the overlay error obtained from the overlay error determination mark and the actual overlay error of the patterns in the semiconductor device.

SUMMARY OF THE INVENTION

An object of the invention is to provide a reticle for determining an overlay error taking an influence by aberration into consideration, as well as a method of determining an overlay error with the reticle and an overlay error determination mark.

According to the invention, an overlay error determination reticle for determining an overlay error between first and second patterns formed at different layers of a wafer includes a transparent substrate, a third pattern and a fourth pattern. The transparent substrate has a main surface, and allows passage of exposure light. The third pattern is formed on the main surface of the transparent substrate to receive the same influence of aberration as that caused by irradiation of light to the first pattern. The fourth pattern is formed on the main surface of the transparent substrate to receive the same influence of aberration as that caused by irradiation of light to the second pattern.

According to the invention, an overlay error determining method of determining an overlay error between first and second patterns formed at different layers of a wafer with an overlay error determination reticle includes the following steps. First, the overlay error determination reticle is prepared. The overlay error determination reticle has a transparent substrate, a third pattern and a fourth pattern. The transparent substrate has a main surface, and allows passage of exposure light. The third pattern is formed on the main surface of the transparent substrate to receive the same influence of aberration as that caused by irradiation of light to the first pattern. The fourth pattern is formed on the main surface of the transparent substrate to receive the same influence of aberration as that caused by irradiation of light to the second pattern. The exposure light passed through the reticle is irradiated to a resist on a wafer for patterning the resist to have a first determination mark corresponding to the third pattern and a second determination mark corresponding to the fourth pattern. By determining positions of the first and second determination marks, the overlay error between the first and second patterns is calculated.

According to the overlay error determination reticle of the invention and the overlay error determining method using the reticle, the third and fourth patterns formed on the transparent substrate are formed to receive the same influences of aberration as the first and second patterns formed on the wafer, respectively. Therefore, the influences of aberration exerted on a detection signal obtained from the third and fourth patterns is the same as those exerted on a detection signal obtained from the first and second patterns. Therefore, determined shift quantities of the third and fourth patterns due to aberration can correspond in one-to-one relationship to shift quantities due to aberration of the first and second patterns formed at the wafer, respectively. Accordingly, by adding shift quantities caused by aberrations of the third and fourth patterns to the overlay error between the reticle for forming the first pattern and the reticle for forming the second pattern, it is possible to obtain an error which corresponds in one-to-one relationship to the overlay error between the first and second patterns formed at the wafer.

The third and fourth patterns are form on the same transparent substrate. Thus, the third and fourth patterns are transferred to the resist in the same step. Therefore, it is possible to prevent distortion in configuration of first determination mark on the wafer corresponding to the third pattern, which may be caused by processing such as thermal processing after formation of the third pattern but before formation of the fourth pattern, and thus such a situation can be prevented that the overlay error of the first and second patterns formed at the wafer cannot be determined accurately due to the distortion. Accordingly, it is possible to determine accurately the overlay error by utilizing aberration at the third and fourth patterns.

An overlay error determination mark according to the invention includes a semiconductor device formation region, an overlay error determination mark formation region, a first semiconductor device component member, a first determination mark, a second semiconductor device component member, and a second determination mark. The semiconductor device formation region is provided for forming at different layers on a semiconductor substrate a plurality of patterns of predetermined configurations forming a semiconductor device. The overlay error determination mark formation region is provided for determining an overlay error between the different layers forming the semiconductor device. The first semiconductor device component member is located in the semiconductor device formation region and is formed at a first layer. The first determination mark is located in said overlay error determination mark formation region and is formed at the overlay error determination mark formation region in the same manufacturing step as the first semiconductor device component member. The second semiconductor device component member is located in the semiconductor device formation region and is formed at a second layer on the first layer. The second determination mark is located in said overlay error determination mark formation region and is formed in the same manufacturing step as the second semiconductor device component member for determining an overlay error between the first semiconductor device component member and the second semiconductor device component member. The first determination mark has a pattern receiving the same influence of aberration as that exerted by irradiation of light to the first semiconductor device component member. The second determination mark has a pattern receiving the same influence of aberration as that exerted by irradiation of light to the second semiconductor device component member.

According to the overlay error determination mark of the invention, the first determination mark has the pattern receiving the same influence of aberration as that exerted by irradiation of light to the first semiconductor device component member, and the second determination mark has the pattern receiving the same influence of aberration as that exerted by irradiation of light to the second semiconductor device component member. The influence of aberration at a detection signal obtained from the first and second determination marks is equal to the influence of aberration at the detection signal obtained from the first and second semiconductor device component members. Accordingly, data based on the detection signal obtained form the first and second determination marks reflects in one-to-one relationship a relationship between the first and second semiconductor device component members.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Embodiment 1

Figure 1A:
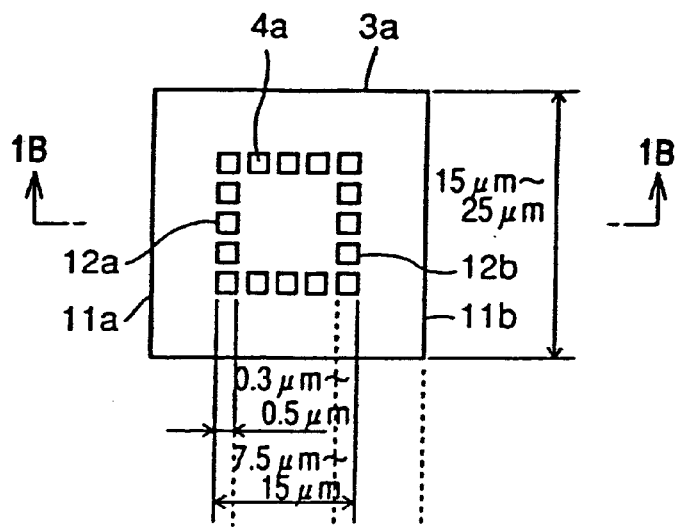
FIG. 1A is a plan of an overlay error determination mark for showing a principle of the overlay error determination mark of an embodiment 1 of the invention.
Figure 1B:
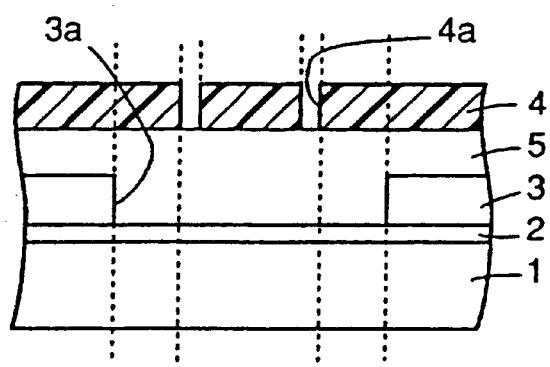
FIG. 1B is a cross section taken along line 1B–1B' in FIG. 1A.

The overlay error determination mark shown in FIGS. 1A and 1B are used for determining an error caused in overlay of large and small patterns in a semiconductor device Referring to FIGS. 1A and 1B, the overlay error determination mark of this embodiment is formed of a first determination mark 3a and a second determination mark 4a. First determination mark 3a is a removed pattern, and is formed at a layer 3. Layer 3 is formed on a semiconductor substrate 1 with an insulating layer 2 therebetween. First determination mark 3a has a square planar configuration, of which one side has a length of 15 to 30 $\mu$m in length.

Second determination mark 4a is formed at a resist film 4. Resist film 4 is formed above first determination mark 3a with an interlayer insulating layer 5 therebetween. Second determination mark 4a is formed of a plurality of pattern holes which are spaced from each other and are arranged to define a square in a plan view. Each of the hole patterns forming second determination mark 4a is a removed pattern, and has a square opening. Each side of the square of each hole pattern has the substantially same size as that of the small pattern in the semiconductor device, and, for example, is 0.3 to 0.5 $\mu$m in length. Each side of the square defined by the plurality of hole patterns forming second determination mark 4a has a size of 7.5 to 15 $\mu$m.

Second determination pattern 4a is arranged above and within a planar region of first determination pattern 3a.

The sizes of first and second determination marks 3a and 4a are defined as described above in order to comply with a demand by an overlay error inspecting device as already described in connection with the prior art. Particularly, the size of each side of the square of first determination mark 3a is determined to be within a range allowed by the overlay error inspection device, and specifically to be substantially equal to that of the side of the large pattern in the semiconductor device.

The size of each hole pattern forming second determination mark 4a is determined to correspond, e.g., to a line width of an interconnection and a diameter of a contact hole which are formed in the same step as second determination mark 4a.

Figure 1C:
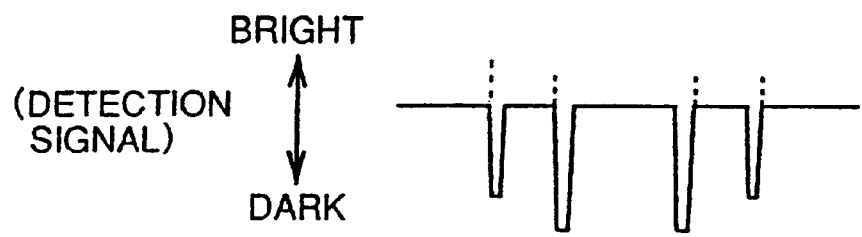
FIG. 1C shows a detection signal along line 1B–1B' in FIG. 1A.

A detection signal which is derived from first and second determination marks 3a and 4a thus constructed has an intensity which lowers at positions of side walls 11a, 11b, 12a and 12b of first and second determination marks 3a and 4a as shown in FIG. 1C.

A method of determining the overlay error in this embodiment will be described below.

Figure 2:
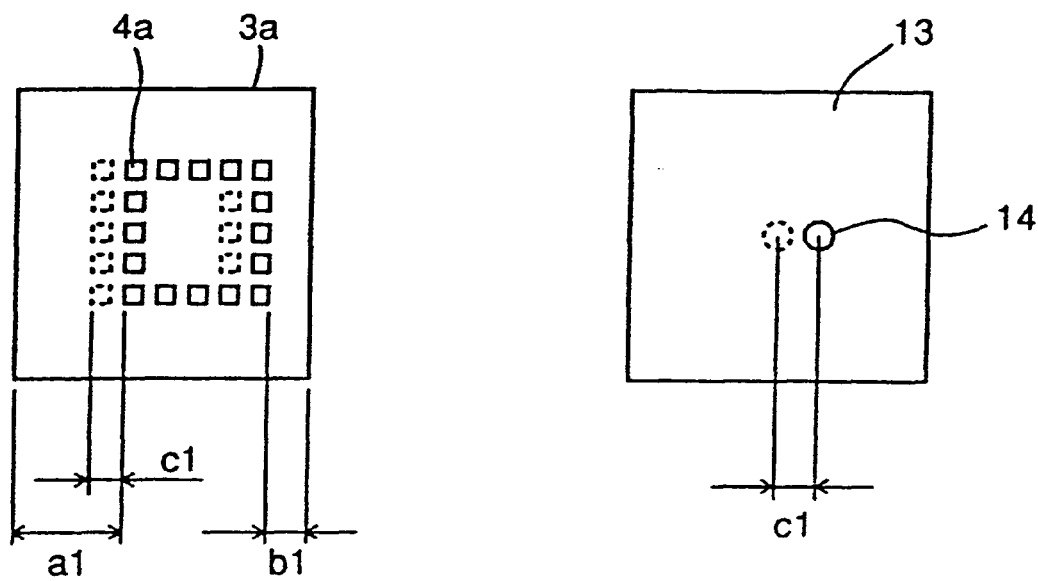
FIG. 2 is a plan for showing a method of determining an overlay error in the embodiment 1 of the invention, and shows structures of the overlay error determination mark and patterns in a semiconductor device.

In FIG. 2, dotted line shows a designed position at which second determination mark 4a would be located if no overlay error occurred, and solid line shows a position of the same when an overlay error occurred. For the sake of illustration, the overlay error is shown merely as such a state that second determination mark 4a is shifted rightward in the figure.

First, positions of side walls 31a, 31b, 32a and 32b of first and second determination marks 3a and 4a are determined from the detection signal in FIG. 1C.

Referring to FIG. 2, a distance a1 between side walls 31a and 32a as well as a distance b1 between side walls 31b and 32b are calculated from the positions of side walls thus determined. With distances a1 and b1, a shift quantity or length c1 is derived from a formula of c1=(a1+b1)/2.

First determination mark 3a has the substantially same size as a large pattern 13 in the semiconductor device, and each hole pattern forming second determination mark 4a has the substantially same size as a hole pattern 14 in the semiconductor device. Therefore, first determination mark 3a is shifted by a quantity substantially equal to that of large pattern 13, and second determination mark 4a is shifted by a quantity substantially equal to that of small pattern 14. Thus, shift quantities of first and second determination marks 3a and 4a due to aberration reflect the shift quantities of patterns 13 and 14, respectively. Therefore, the detection signal shown in FIG. 1C contains the substantially same influence by aberration as patterns 13 and 14 formed in the semiconductor device. Accordingly, the relationship in misregistration between first and second determination marks 3a and 4a corresponds in one-to-one relationship to the relationship in misregistration between large and small patterns 13 and 14 in the semiconductor device.

Consequently, results derived from determination of the overlay error can be highly reliable, whereby it is possible to provide a high-performance semiconductor device.

Figure 3:
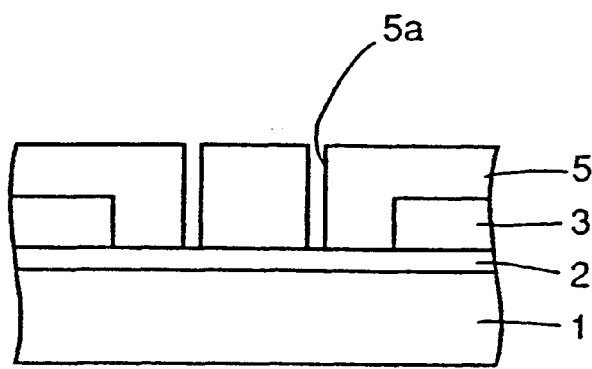
FIG. 3 is a cross section showing a state in which a resist is removed after etching is effected on a structure shown in FIG. 1C using the resist as a mask.

FIG. 3 shows a structure which is formed by effecting anisotropic etching on interlayer insulating layer 5 in FIG. 1B using resist film 4 as a mask, and then removing resist film 4.

In this case, as shown in FIG. 3, a plurality of holes 5a which correspond to hole patterns forming the second determination mark and are located within a planar region of first determination mark 3a, are formed at interlayer insulating layer 5.

Embodiment 2

Figure 4A:
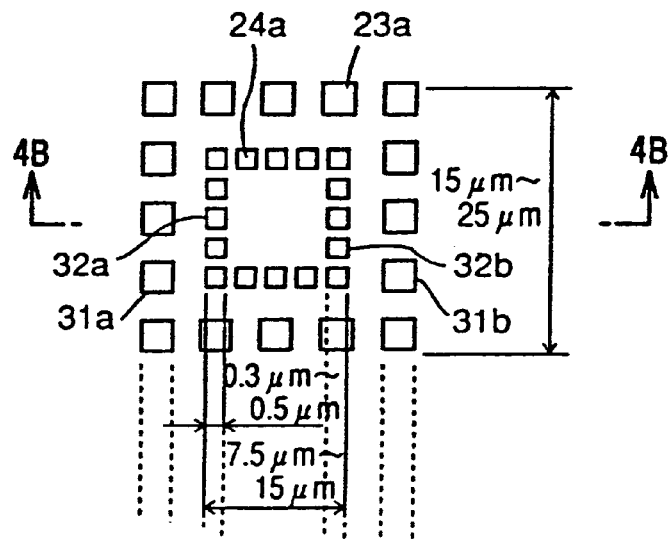
FIG. 4A is a plan of an overlay error determination mark for showing a principle of the overlay error determination mark of an embodiment 2 of the invention.
Figure 4B:
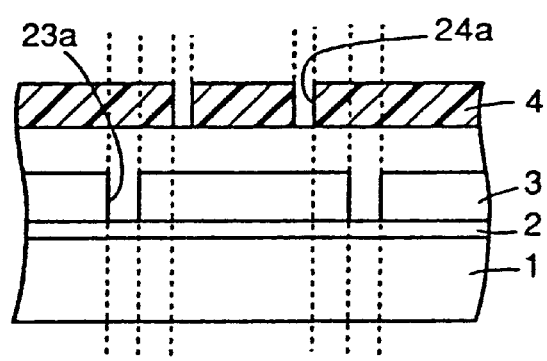
FIG. 4B is a cross section taken along line 4B–4B' in FIG. 4A.

An embodiment 2 shown in FIGS. 4A and 4B differs from the embodiment 1 in that it is intended to determine an error in overlay of two small patterns which are formed in the semiconductor device.

Referring to FIGS. 4A and 4B, an overlay error determination mark of this embodiment is formed of first and second determination marks 23a and 24a.

First determination mark 23a is formed at layer 3 which is formed on semiconductor substrate 1 with insulating layer 2 therebetween. First determination mark 23a includes a plurality of hole patterns which are arranged to define a square. Each of these hole patterns has a square opening. Each side of the square opening has the substantially same size as that of one of the small patterns to be overlaid in the semiconductor device, and, for example, has a size of 0.3 to 0.5 $\mu$m. First determination pattern 23 formed of the plurality of hole patterns has the square configuration, of which one side is 15 to 25 μm in length.

Second determination mark 24a is formed at a resist film 4 which is formed on layer 3 with interlayer insulating layer 5 therebetween, and is located within a planar region of first determination mark 23a. Second determination mark 24a is formed of a plurality of hole patterns arranged to define a square. Each hole pattern forming second determination mark 24a has a square opening. Each side of this square opening is substantially equal in length to that of the other small patter to be overlaid in the semiconductor device, and has a size, e.g., of 0.3 to 0.5 μm. Second determination mark 24a formed of the plurality of holes has the square configuration, of which one side is 7.5 to 15 μm in length.

The sizes of squares of first and second determination marks 23a and 24a are defined as described above in order to comply with a requirement by an overlay error inspecting device as already described in connection with the prior art.

Figure 4C:
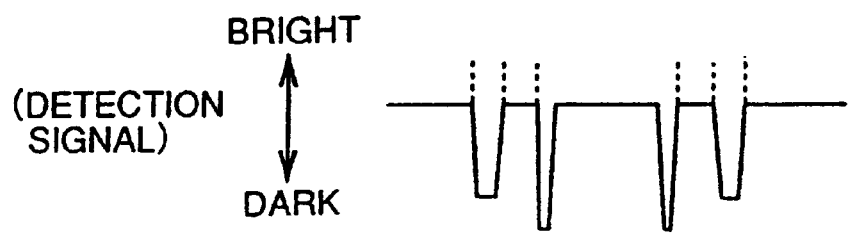
FIG. 4C shows a detection signal along line 4B–4B' in FIG. 4A.

A detection signal which is derived from first and second determination marks 23a and 24a thus constructed has an intensity which lowers at positions of side walls 31a, 31b, 32a and 32b of first and second determination marks 23a and 24a as shown in FIG. 4C.

A method of determining the overlay error in this embodiment will be described below.

Figure 5:
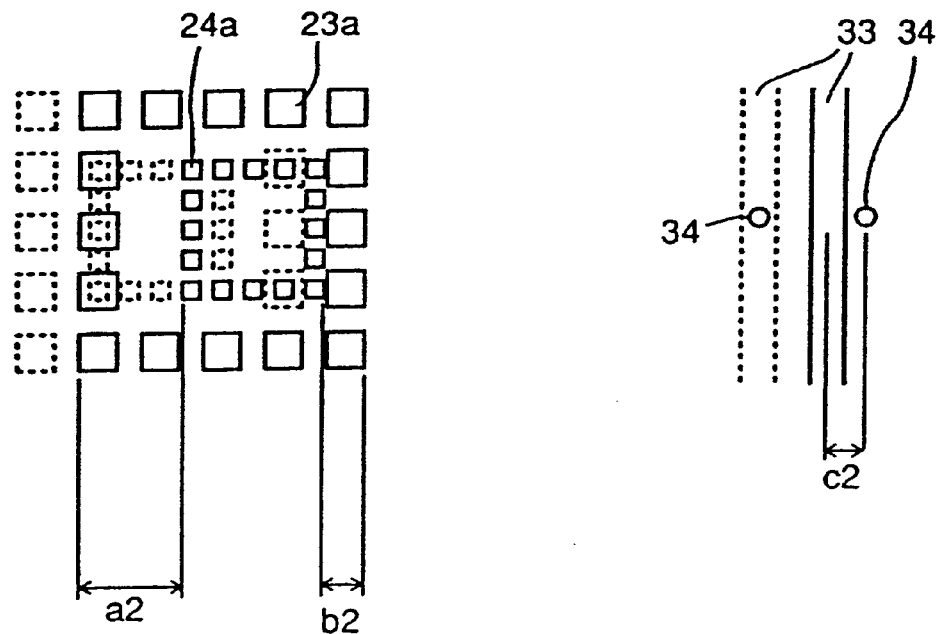
FIG. 5 is a plan for showing a method of determining an overlay error in the embodiment 2 of the invention, and shows structures of the overlay error determination mark and patterns in a semiconductor device.

In FIG. 5, dotted line shows designed positions at which first and second determination marks 23a and 24a would be located if no overlay error occurred, and solid line shows positions of the same when an overlay error occurred. For the sake of illustration, the overlay error is shown merely as such a state that first and second determination marks 23a and 24a are shifted rightward in the figure similarly to the first embodiment.

First, positions of side walls 31a, 31b, 32a and 32b of first and second determination marks 23a and 24a are determined from the detection signal in FIG. 4C.

Referring to FIG. 5, a distance a2 between side walls 31a and 32a as well as a distance b2 between side walls 31b and 32b are calculated from the positions of side walls thus determined. With distances a2 and b2, a shift quantity c2 is derived from a formula of c2=(a2+b2)/2.

Each hole pattern forming first determination mark 23a has an open diameter substantially equal to a line width of a first small pattern (e.g., word line) 33, and each hole pattern forming second determination mark 24a has the substantially same open size as a second small pattern (e.g., contact hole) 34. Accordingly, the relationship in misregistration between first and second determination marks 23a and 24a corresponds in one-to-one relationship to the relationship in misregistration between large and small patterns 33 and 34, as already described in connection with the embodiment 1.

Consequently, results derived from determination of the overlay error can be highly reliable, whereby it is possible to provide a high-performance semiconductor device.

Figure 6:
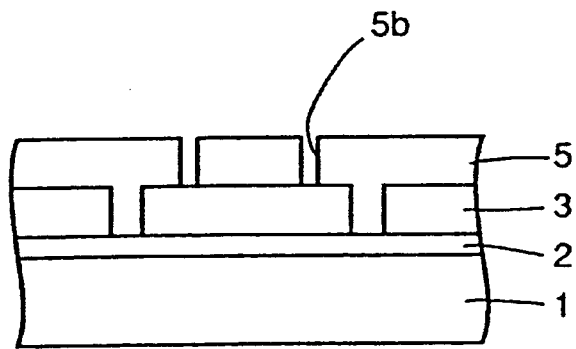
FIG. 6 is a cross section showing a state in which a resist is removed after etching is effected on a structure shown in FIG. 4C using the resist as a mask.

FIG. 6 shows a structure which is formed by effecting anisotropic etching on interlayer insulating layer 5 in FIG. 4B using resist film 4 as a mask, and then removing resist film 4.

In this case, as shown in FIG. 6, a plurality of holes 5b which correspond to the hole patterns forming the second determination mark are formed at interlayer insulating layer 5, and are located within a planar region of first determination mark 23a.

The embodiments 1 and 2 have been described in connection with the structures in which each of first determination mark 23a and second determination marks 4a and 24a is formed of the plurality of hole patterns. However, the invention is not restricted to these structures, and may be applied to such a structure that each of first determination mark 23a and second determination marks 4a and 24a is formed of a frame-like pattern defined by continuing these plurality of hole patterns, in which case a similar effect can be achieved.

First determination mark 23a and second determination marks 4a and 24a are formed of the removed or hollow patterns, but each may be defined by a plurality of remained or solid patterns, which are arranged to define a square and each have a square planar configuration. Each of first determination mark 23a and second determination marks 4a and 24a is not restricted to the structure formed of the plurality of remained square patterns arranged to define a square, but may be formed of a remained pattern having a square frame-like configuration.

Embodiment 3

The embodiments 1 and 2 described above allow determination of the overlay error taking a shift by aberration into consideration.

(1) However, such a case may exist that the overlay error determination marks of the embodiments 1 and 2 cannot be used, e.g., due to various restrictions and it is necessary to use an overlay error determination mark of the Box-in-Box type shown as the prior art. In this case, it is impossible to determine an overlay error taking a shift by aberration into consideration in contrast to the above embodiments.

(2) Particularly, the overlay error determination mark of the type of the embodiment 2 may cause such a situation that the hole pattern forming first determination mark 23a changes its shape, and thus the overlay error cannot be determined. This change or distortion of the hole pattern forming the overlay error determination mark of the embodiment 2 will be described below.

Figure 7A:
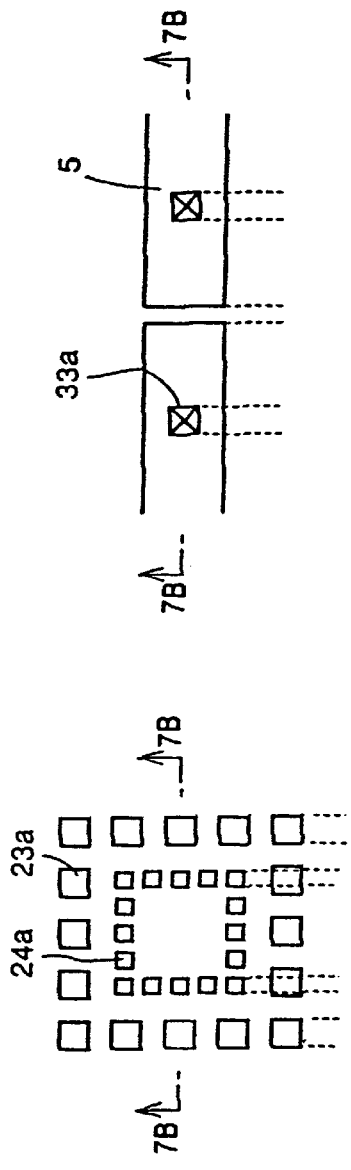
FIGS. 7A and 7B are a plan and a cross section showing change in hole configuration of a first determination mark in the overlay error determination mark in the embodiment 2, respectively.
Figure 7B:
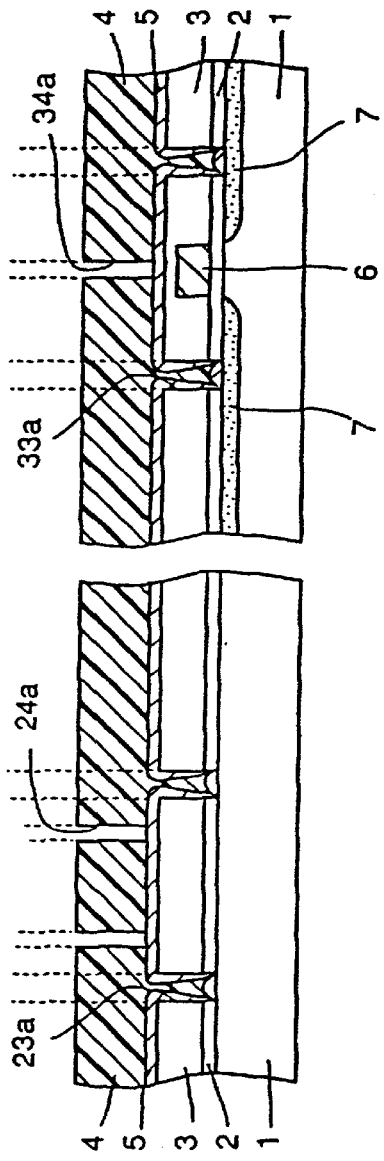
Figure 8:
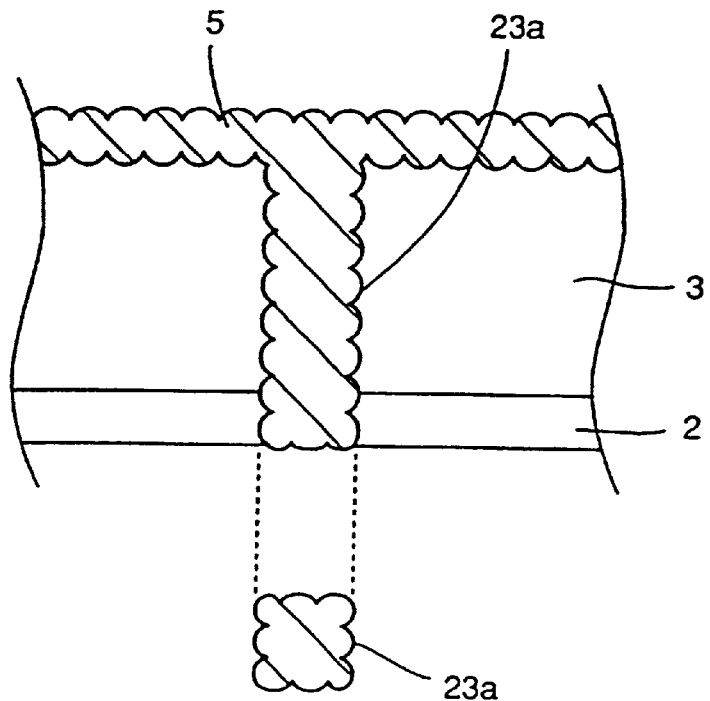
FIG. 8 shows the fact that the hole configuration changes when grains in an aluminum layer grow.

Referring to FIGS. 7A and 7B, a semiconductor device has, for example, such a structure that an MOS transistor formed of paired source/drain regions 7, gate insulating layer 2 and gate electrode layer 6 are formed on a surface of semiconductor substrate 1. Contact holes 33a reaching source/drain regions 7 of this MOS transistor are formed at interlayer insulating layer 3 and gate insulating layer 2.

The hole patterns, which construct first determination mark 23a formed of removed patterns, are located within a region for forming the overlay error determination mark, and are formed at interlayer insulating layer 3 and gate insulating layer 2 simultaneously with formation of contact hole 33a.

An aluminum layer 5 which covers inner walls of contact hole 33a and the hole patterns forming first determination mark 23a is formed over the whole surface. Resist film 4 used for patterning aluminum layer 5 is provided with a hole pattern 34a and hole patterns forming second determination mark 24a.

In this structure, if aluminum layer 5 is formed by a sputtering method, a sufficient coverage is not be attained at a bottom of each contact hole 33a so that aluminum layer 5 may be broken. Therefore, reflow at a high temperature and a high pressure is effected on aluminum layer 5. The high-temperature and high-pressure reflow is disclosed, e.g., by Young-Hong Min et al., "Effective alignment techniques and its implementation to enhance total overlay accuracy on highly reflective films", SPIE Vol. 2439, pp. 287–297. This reflow grows grains of aluminum layer 5, so that aluminum layer 5 fully fills holes of second determination mark 24a and contact holes 33a, and thus breakage of aluminum layer 5 is prevented.

Figure 9:
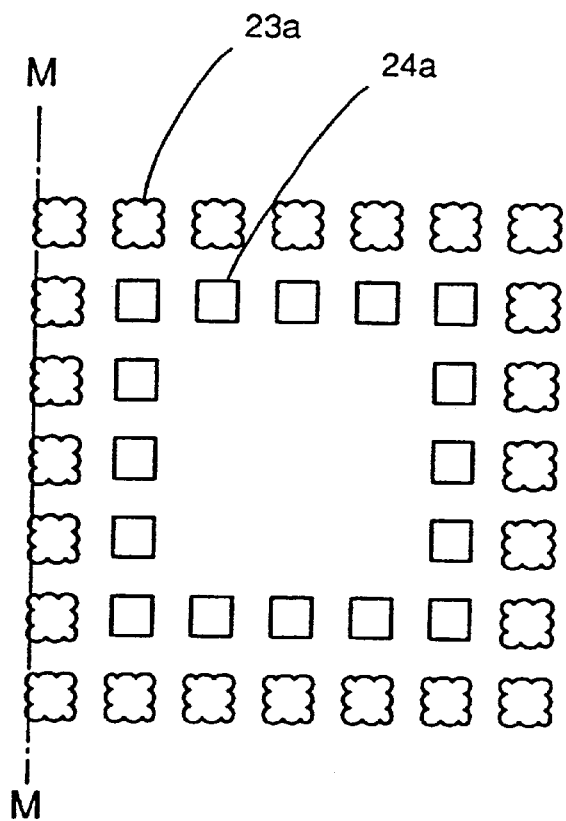
FIG. 9 is a plan showing distortion of each hole configuration of the first determination mark in the overlay error determination mark in the embodiment 2 of the invention.

However, as the grains of aluminum layer 5 grow, each hole forming second determination mark 24a changes its configuration, and its wall is distorted along configurations of aluminum grains. Therefore, it is difficult to determine positions (e.g., positions indicated by alternate long and short dash line) of side walls of first determination mark 24a as shown in FIG. 9.

For example, the fact that growth of aluminum grains to 1 μm or more makes the position determination difficult is disclosed by S. Katagiri et al., "Overlay Error Estimation of Wafer Rear Surface Alignment for 0.1-μm Lithography", Jpn, J. Appl. Phys. Vol. 32 (1993) Pt. 1, No. 12B, pp. 6039–6043.

Problems of the above items (1) and (2) can be overcome by using data obtained with the aberration estimation reticle of this embodiment.

Figure 10:
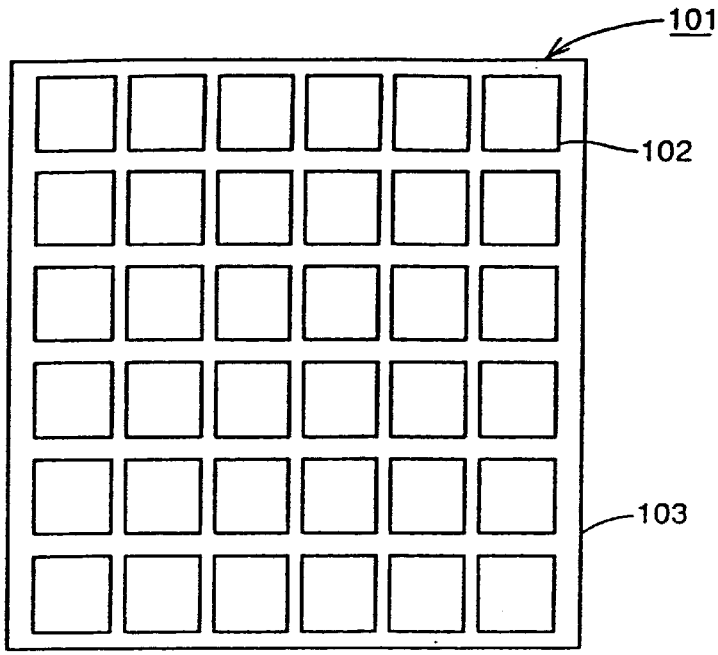
FIG. 10 is a plan schematically showing a structure of aberration estimation reticle in an embodiment 3 of the invention.

Referring mainly to FIG. 10, an aberration estimation reticle 101 has a plurality of units 102 distributed over a whole surface of a transparent substrate 103 and spaced from each other.

Figure 11:
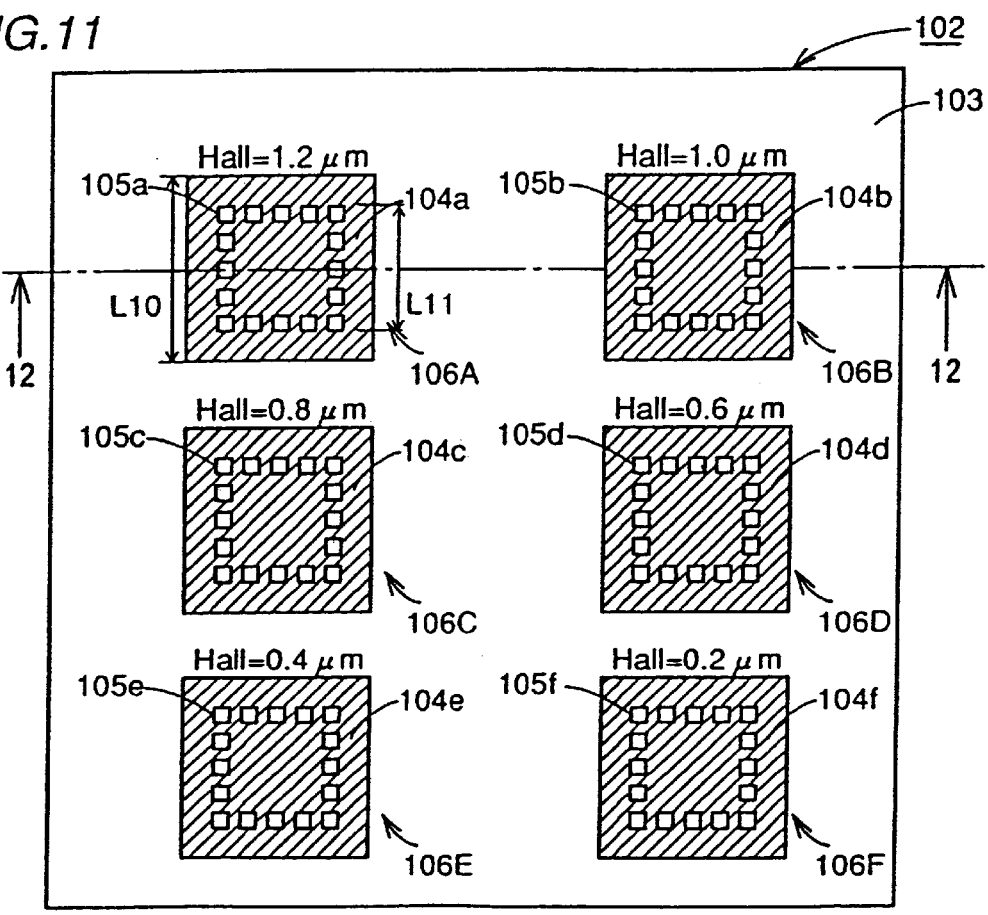
FIG. 11 is a schematic plan showing, on an enlarged scale, structures in units of the aberration estimation reticle in the embodiment 3 of the invention.

Referring mainly to FIG. 11, each unit 102 is provided with six pattern groups 106A–106F. For example, pattern group 106A is provided with a first pattern 104a and a second pattern 105a.

First pattern 104a is square in planar shape. Second pattern 105a is formed of a plurality of holes which are located within a planar region of first pattern 104a and are arranged to define a square along first pattern 104a.

The holes of each of second patterns 104a–104f, which are provided at these six pattern groups 106A–106F, respectively, are different in diameter from those of the other second patterns. Thus, the diameters of holes forming second patterns 104a–104f ranges from 0.2 μm to 1.2 μm in increments of 0.2 μm.

Figure 12:
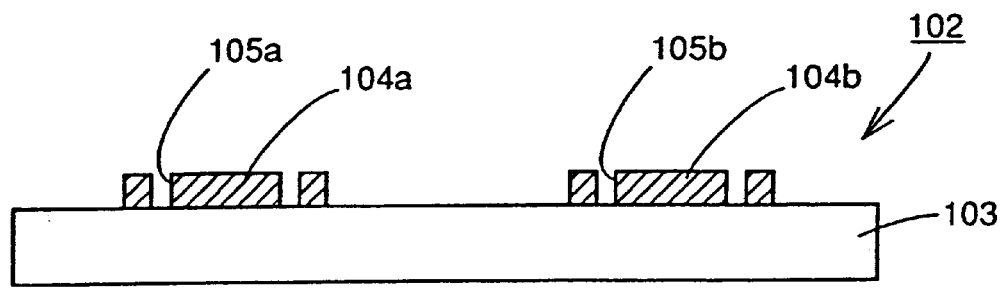
FIG. 12 is a schematic cross section taken along line 12–12' in FIG. 11.

Referring mainly to FIG. 12, first patterns 104a–104f are formed of remained patterns made of a shade or light interception film formed on transparent substrate 103. Second patterns 105a–105f are formed of removed patterns formed at the shade film.

Referring mainly to FIG. 11, it is preferable that each of squares of first patterns 104a–104f has a size L10 of 15 to 25 μm, but size L10 may be arbitrarily selected in a range from 10 to 60 μm depending on a pattern configuration in the semiconductor device. It is preferable that each of squares of second patterns 105a–105f has a size L11 in a range from 7.5 to 15 μm.

The shift quantity due to aberration can be determined with the aberration estimation reticle of the embodiment shown in FIGS. 10 to 12. Description will now be given on a method of determining the shift quantity due to aberration with the aberration estimation reticle of the embodiment.

First, exposure light beams passed through aberration estimation reticle 101 of this embodiment are irradiated to a resist film applied onto a wafer. Subsequently, processing such as development is performed to transfer first and second patterns 104a–104f and 105a–105f of aberration estimation reticle 101 onto the resist film, so that the first estimation mark corresponding to the first patterns and second estimation mark corresponding to the second patterns are formed at the resist film.

As an example, one of pattern groups 106a of the aberration estimation reticle 101 of this embodiment will be described below with reference to FIG. 13. Pattern group 106a is transferred onto resist film 4, so that first determination mark $104a_1$ corresponding to first pattern 104a and second determination mark $105a_1$ corresponding to second pattern 105a are formed.

First determination mark $104a_1$ is formed of a remained pattern at resist film 4, and second determination mark $105a_1$ is formed of removed patterns at resist film 4. One side of a square of first determination mark $104a_1$ has a size L12, which is significantly larger than a size L13 of one side of a square of each hole pattern forming second determination mark $105a_1$. During transfer, therefore, a larger influence by aberration is exerted on second determination mark $105a_1$ than first determination mark $104a_1$. Thus, a shift quantity of second determination mark $105a_1$ is larger than that of first determination mark $104a_1$.

Here, size L12 of first determination mark $104a_1$ is at least 100 times larger than size L13 of the hole forming second determination mark $105a_1$. Therefore, the shift quantity of first determination mark $104a_1$ due to aberration is remarkably smaller than the shift quantity of second determination mark $105a_1$ due to aberration, and thus can be ignored.

Therefore, the shift quantities of first determination marks $104a_1$ and $105a_1$ can be determined by a method similar to that of the embodiment 1 shown in FIG. 2.

Figure 13:
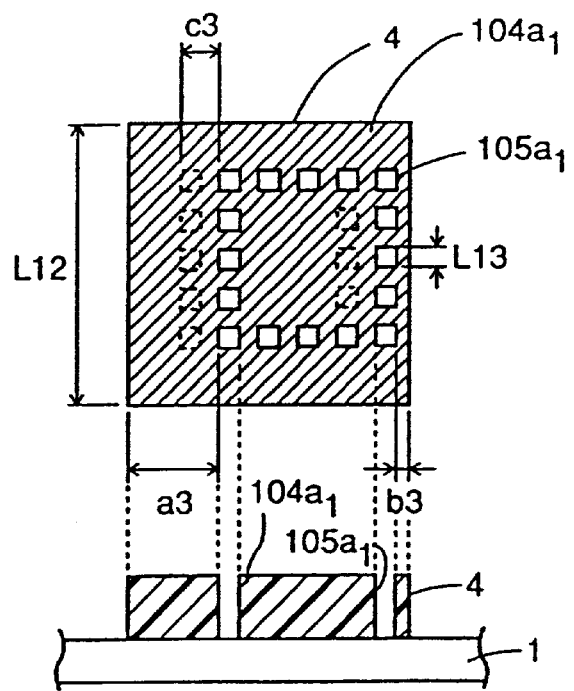
FIG. 13 shows a method of determining a quantity of shift caused by aberration using the aberration estimation reticle in the embodiment 3 of the invention.

Referring to FIG. 13, processing is first performed to determine positions of the side walls of first and second determination marks $104a_1$ and $105a_1$. Distances a3 and b3 between side walls of first and second determination marks $104a_1$ and $105a_1$ are derived from these determined values. With distances a3 and b3, a shift quantity c3 between first and second determination marks $104a_1$ and $105a_1$ is derived from a formula of $c3=(a3-b3)/2$.

Generally, shift quantity c3 between first and second determination marks $104a_1$ and $105a_1$ consists of a sum of shift quantities of respective reticles for forming first and second determination marks $104a_1$ and $105a_1$, a shift quantity of first determination mark $104a_1$ due to aberration and a shift quantity of second determination mark $105a_1$ due to aberration.

In the aberration estimation reticle of this embodiment, first and second determination marks $104a_1$ and $105a_1$ are formed by transfer of first and second patterns 104a and 105a, both of which are formed at the single reticle. Therefore, the shift quantity between the reticle forming first determination mark $104a_1$ and the reticle forming second determination mark $105a_1$ is zero. As already described, the size L12 of the pattern of first determination mark $104a_1$ is significantly larger than size L13 of the patter of second determination mark $105a_1$. Accordingly, the shift quantity of first determination mark $104a_1$ due to aberration can be deemed to be zero.

From the foregoing, shift quantity c3 between first and second determination marks $104a_1$ and $105a_1$ which is determined as described before corresponds to the shift quantity of second determination mark $105a_1$ due to aberration.

By using the aberration estimation reticle of the embodiment as described above, shift quantity c3 of the second determination mark due to aberration can be obtained for various values from 0.2 μm to 1.2 μm of the opening diameter of the hole forming second determination mark 105a.

Figure 14:
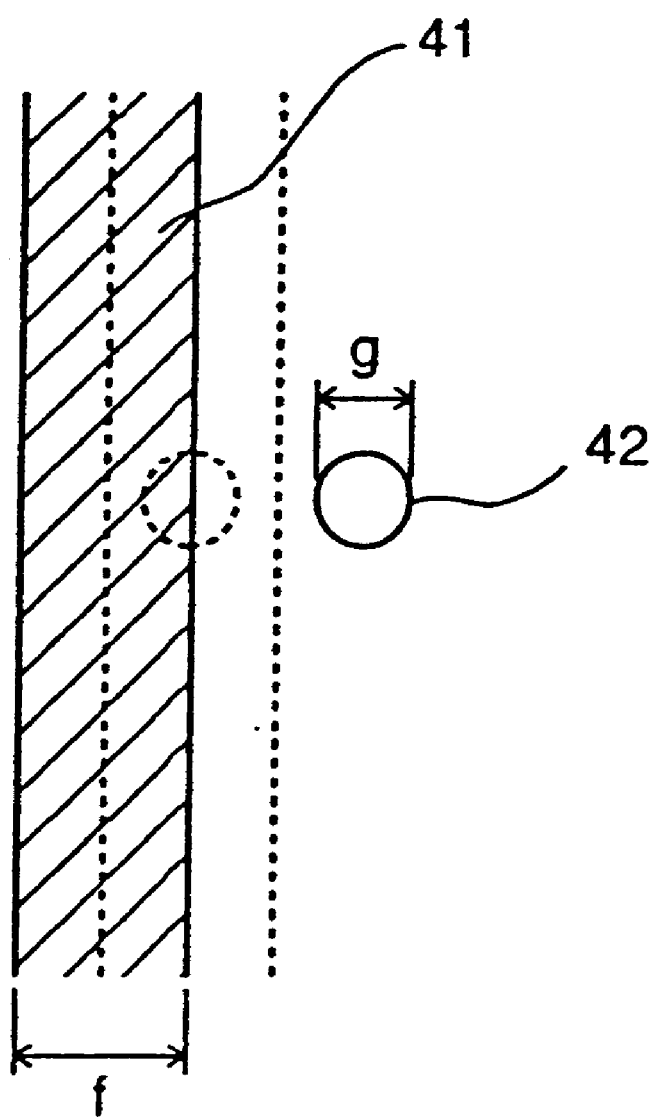
FIG. 14 shows a manner of determining an overlay error using the aberration estimation reticle in the embodiment 3 of the invention.
Figure 15:
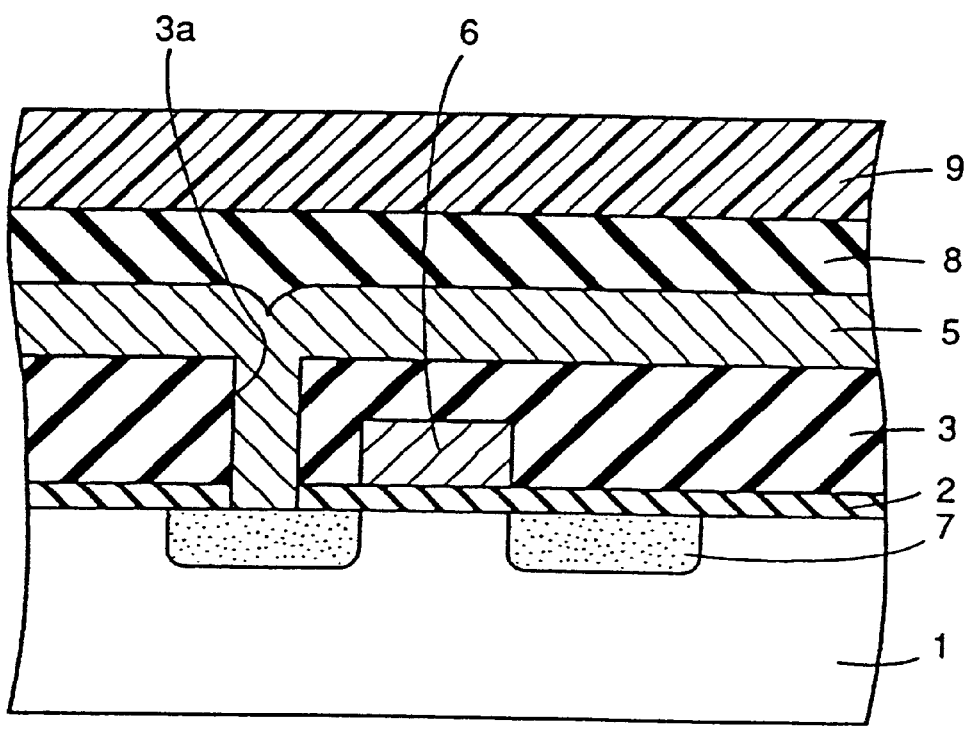
FIG. 15 is a cross section showing a structure of an MOS transistor in the prior art.
Figure 16:
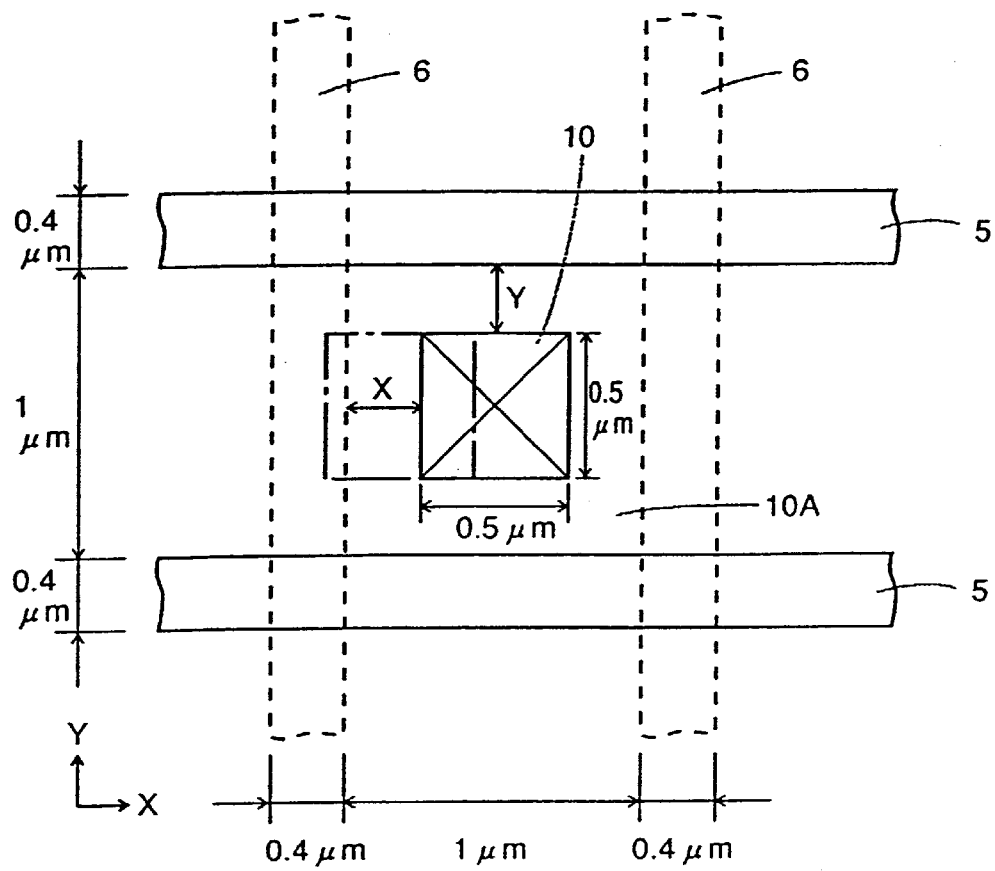
FIG. 16 is a plan showing a structure in which a contact hole is formed at a region defined between word lines and bit lines in the prior art.
Figure 17:
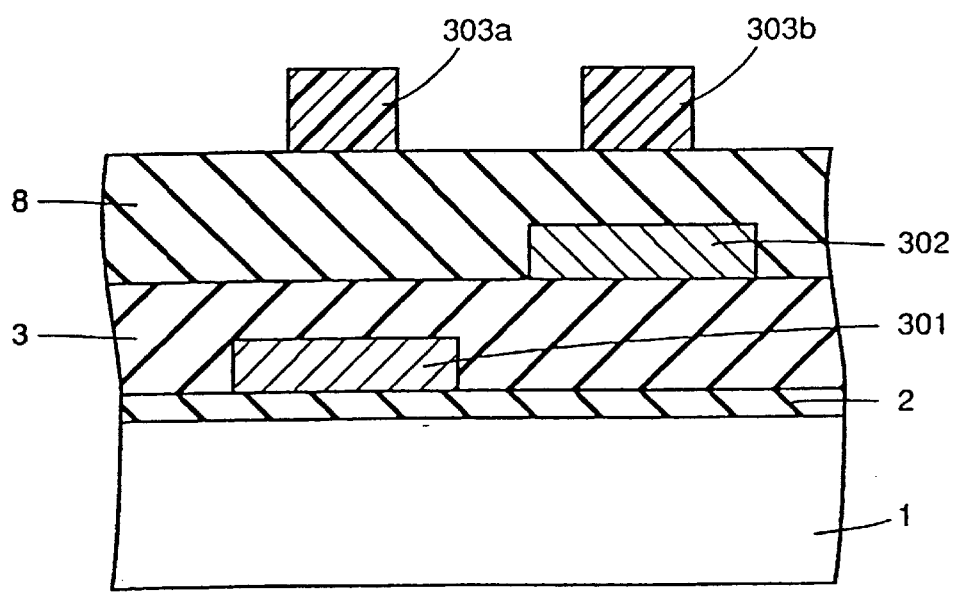
FIG. 17 is a cross section showing a structure of an overlay error determination mark in the prior art.
Figure 18A:
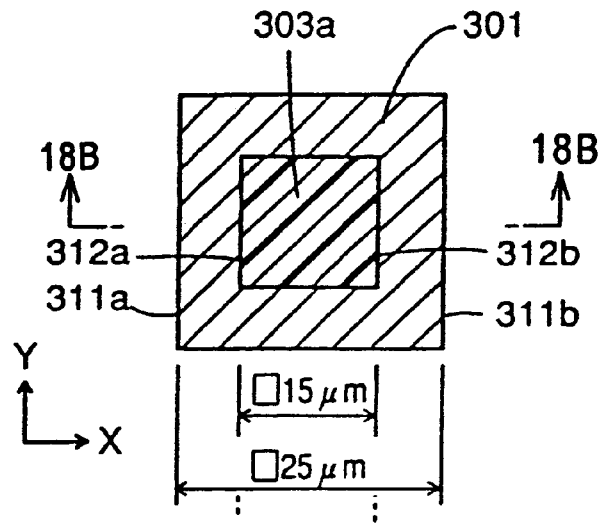
FIG. 18A is a plan of the overlay error determination mark for showing a principle of the overlay error determination mark in the prior art.
Figure 18B:
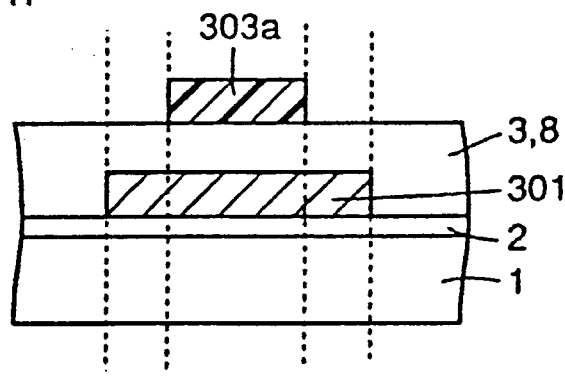
FIG. 18B is a cross section taken along line 18B–18B' in FIG. 18A.
Figure 18C:
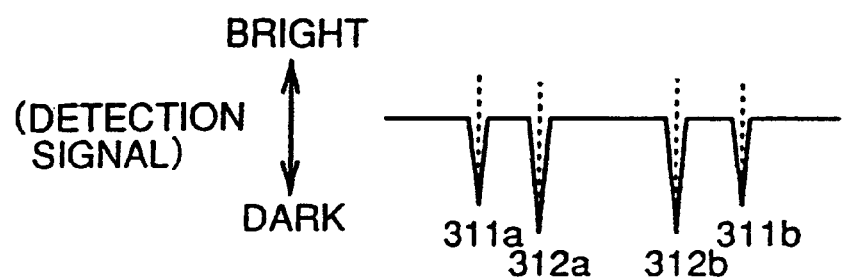
FIG. 18C shows a detection signal along line 18B–18B' in FIG. 18A.
Figure 19:
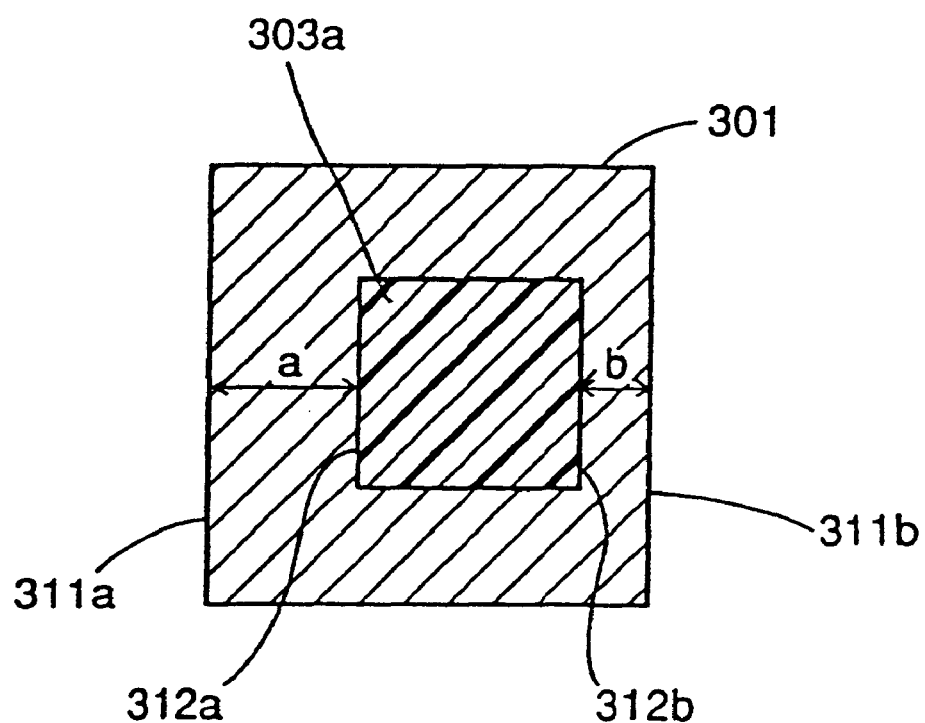
FIG. 19 shows a method of determining an overlay error with the overlay error determination mark in the prior art.
Figure 20:
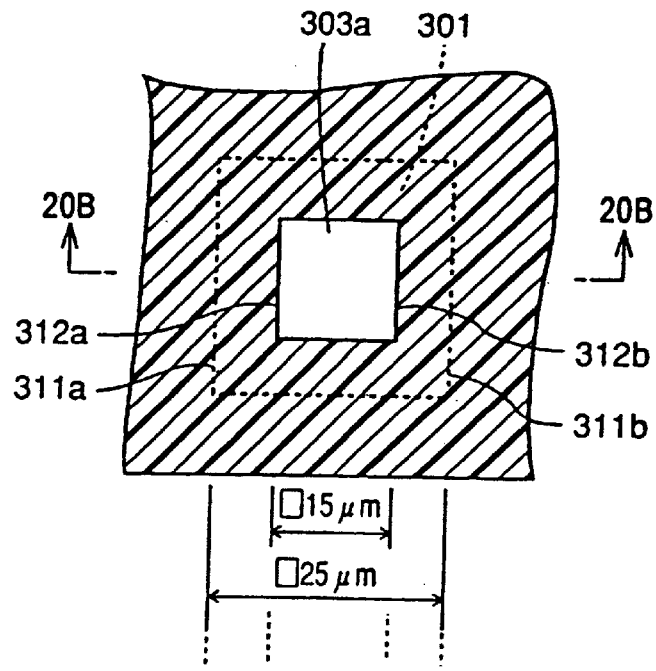
FIG. 20A is a plan of the overlay error determination mark for showing a principle of the overlay error determination mark corresponding to that in FIG. 18 but having a removed pattern.
FIG. 20B is a cross section taken along line 20B–20B' in FIG. 20A.
FIG. 20C shows a detection signal along line 20B–20B' in FIG. 20A.
Figure 20B:
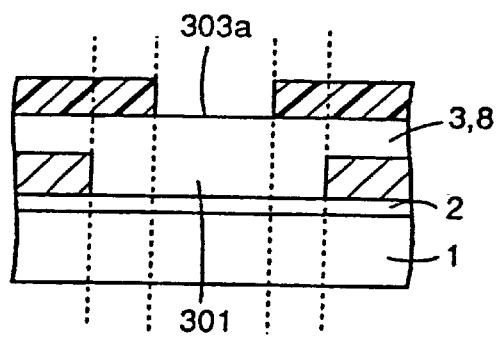
Figure 20C:
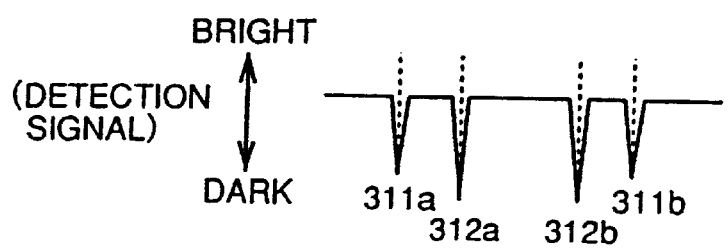
Figure 21A:
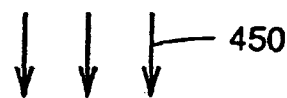
FIGS. 21A, 21B and 21C are a first set of figures showing a problem of coma aberration, and specifically showing a resist pattern and a relationship between a photomask and a light intensity.
Figure 21A:
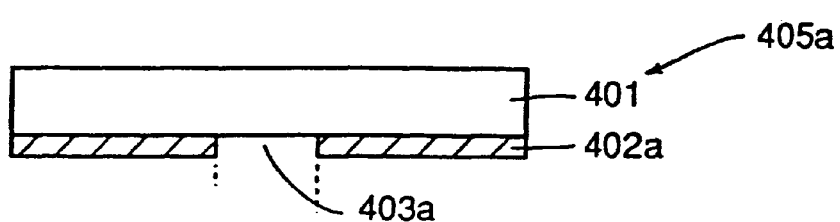
Figure 21B:
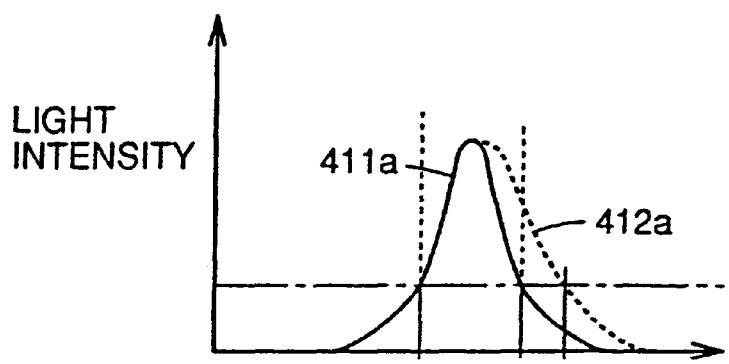
Figure 21C:
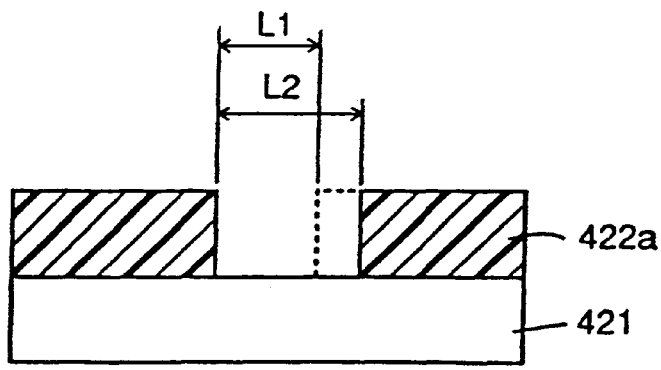
Figure 22A:
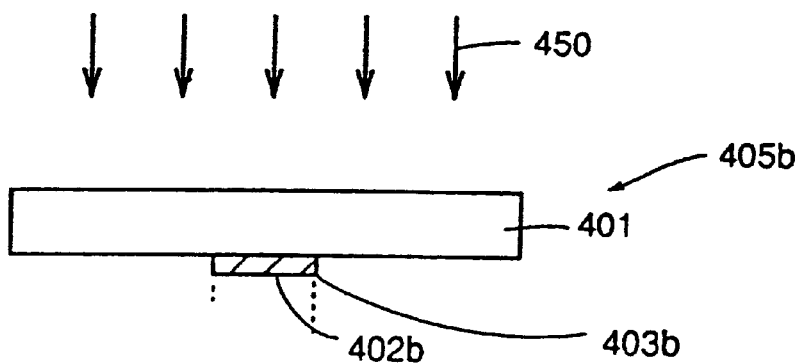
FIGS. 22A, 22B and 22C are a second set of figures showing a problem of coma aberration, and specifically showing a resist pattern and a relationship between a photomask and a light intensity.
Figure 22B:
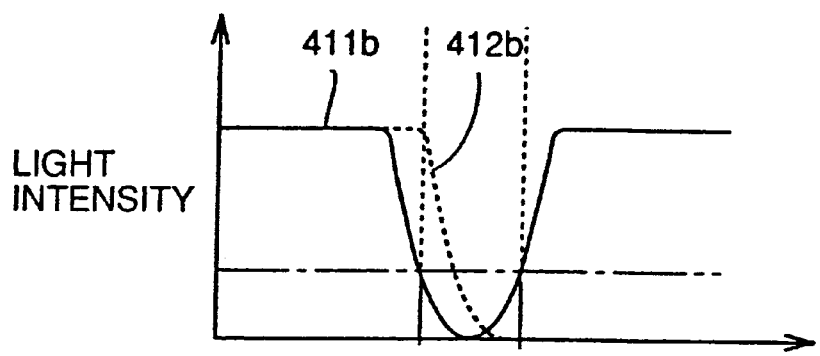
Figure 22C:
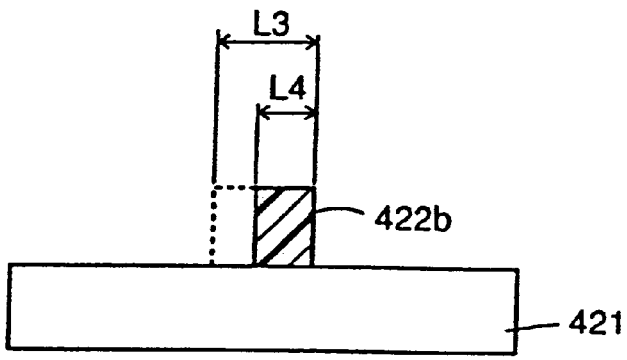
Figure 23A:
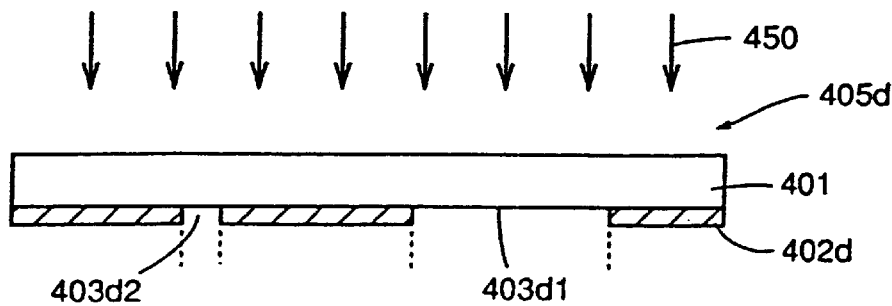
FIGS. 23A, 23B and 23C show a problem of a coma aberration arising from the photomask in the prior art, and specifically show a resist pattern and a relationship between a photomask and a light intensity.
Figure 23B:
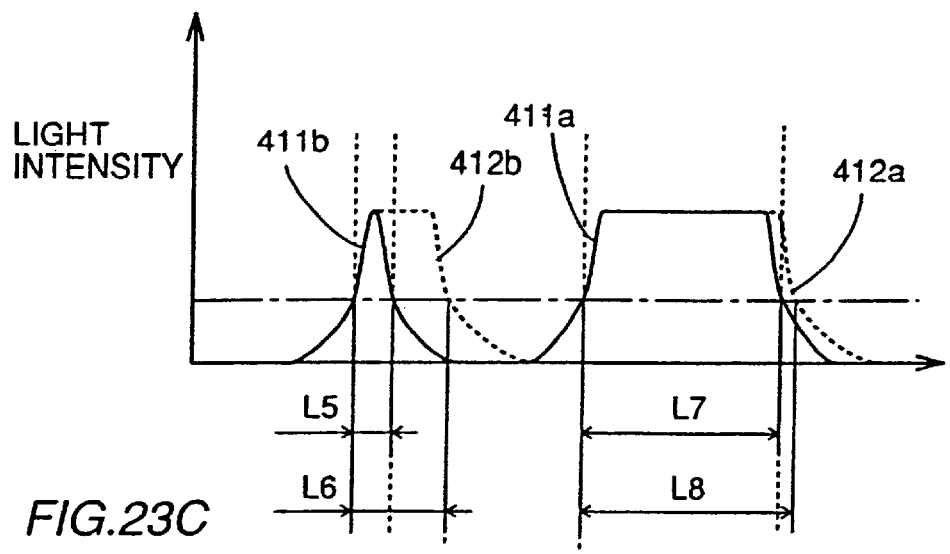
Figure 23C:
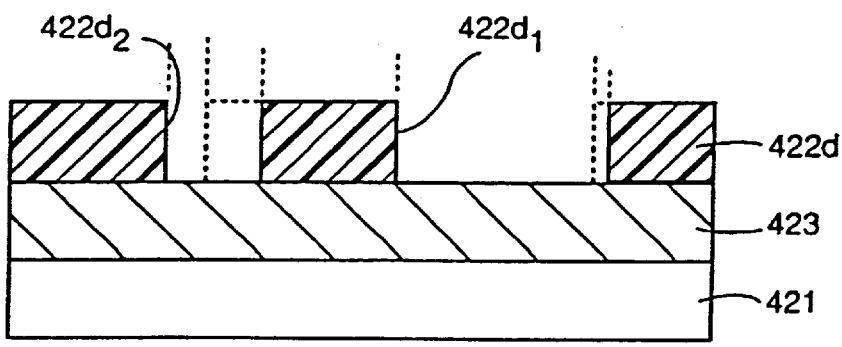

Thereby, the overlay error between an interconnection layer 41 having a line width f and a contact hole 42 of a opening diameter g shown in FIG. 14 can be derived as follows.

An overlay error between interconnection layer 41 and contact hole 42 can be derived from a sum $(\alpha+\beta 1+\beta 2)$ of a shift quantity α between two overlaid reticles, a shift quantity β1 of interconnection layer 41 due to aberration and a shift quantity β2 of contact hole 42 due to aberration. The above shift quantity α between two reticles can be obtained with the overlay error determination mark of the Box-in-Box type in the prior art. In the case where interconnection layer 41 has line width f of, e.g., 0.4 μm, shift quantity c3 of second determination mark 104e due to aberration, which is derived with one of pattern groups 106E (FIG. 11) in aberration estimation reticle 101 of this embodiment, corresponds to quantity β1. In the case where opening diameter g of contact hole 42 is 0.2 μm, shift quantity c3 of second determination mark 104f due to aberration, which is derived with one of pattern groups 106F (FIG. 11) in aberration estimation reticle 101 of this embodiment, corresponds to quantity β2.

As described before, the overlay error can be calculated accurately and easily by determining the shift quantity due to aberration of the second opening determination mark with respect to holes having various diameters.

The aberration estimation reticle of this embodiment allows calculation of the overlay error taking into consideration the quantity of shift caused by aberration. Therefore, even with the conventional overlay error determination mark of the Box-in-Box type, it is possible to calculate the overlay error which corresponds in one-to-one relationship to the shift between the overlaid patterns in the semiconductor device.

According to the aberration estimation reticle of this embodiment, first and second determination marks $104a_1$ and $105a_1$ are formed with first and second patterns $104a$ and $105a$ formed at the single reticle. Thus, first and second determination marks $104a_1$ and $105a_1$ are transferred to the resist film in the same step. Therefore, it is possible to prevent distortion in configuration of first determination mark $104a_1$ due to processing such as thermal processing after formation of first determination mark $104a_1$ but before formation of second determination mark $105a_1$. Accordingly, it is possible to determine accurately the overlay error between first and second determination marks $104a_1$ and $105a_1$.

Generally, in reticle 101 as shown in FIG. 10, a difference occurs in the shift quantity due to aberration between a pattern arranged at a central region of reticle 101 and a pattern arranged at a peripheral region thereof. In aberration estimation reticle 101 of this embodiment, therefore, respective units 102 are distributed over the whole surface of transparent substrate 103. Thereby, data can be derived from the first and second determination marks in unit 102 arranged at a position corresponding to a position in the reticle, at which the patterns used for intended determination of the overlay error are arranged, so that it is possible to prevent shift or error, which may be caused due to the fact that data is derived based on a different position in the reticle.

Although the embodiments have been described and illustrated in detail, it is clearly understood that these embodiments are by way of illustration and example only and are not to be taken by way of limitation. The spirit and scope of the present invention being limited only by the terms of the appended claims.

According to the overlay error determination reticle of the invention and the overlay error determining method using the reticle, the third and fourth patterns formed on the transparent substrate are formed to receive the same influences of aberration as the first and second patterns formed on the wafer, respectively. Therefore, the influences of aberration exerted on a detection signal obtained from the third and fourth patterns is the same as those exerted on a detection signal obtained from the first and second patterns. Therefore, determined shift quantities of the third and fourth patterns due to aberration can correspond in one-to-one relationship to shift quantities due to aberration of the first and second patterns formed at the wafer, respectively. Accordingly, it is possible to obtain an error which corresponds in one-to-one relationship to an overlay error between the first and second patterns formed at the wafer.

The third and fourth patterns are form on the single transparent substrate. Therefore, it is possible to prevent distortion in configuration of first determination mark on the wafer corresponding to the third pattern, which may be caused by processing such as thermal processing after formation of the third pattern but before formation of the fourth pattern, and thus such a situation can be prevented that the overlay error of the first and second patterns formed at the wafer cannot be determined accurately. Accordingly, it is possible to determine accurately the overlay error.

According to the overlay error determination mark of the invention, the first determination mark has the pattern receiving the same influence of aberration as that exerted by irradiation of light to the first semiconductor device component member, and the second determination mark has the pattern receiving the same influence of aberration as that exerted by irradiation of light to the second semiconductor device component member. Accordingly, data based on the detection signal obtained form the first and second determination marks reflects in one-to-one relationship a relationship between the first and second semiconductor device component members.

What is claimed is:

1. An overlay error determination mark comprising:

a semiconductor device formation region provided for forming at different layers on a semiconductor substrate a plurality of patterns of predetermined configurations forming a semiconductor device;

an overlay error determination mark formation region for determining an overlay error between said different layers forming said semiconductor device;

a first semiconductor device component member located in said semiconductor device formation region and formed at a first layer;

a first determination mark located in said overlay error determination mark formation region and formed at said overlay error determination mark formation region in the same manufacturing step as said first semiconductor device component member;

a second semiconductor device component member located in said semiconductor device formation region and formed at a second layer on said first layer; and a second determination mark located in said overlay error determination mark formation region and formed in the same manufacturing step as said second semiconductor device component member for determining an overlay error between said first semiconductor device component member and said second semiconductor device component member, wherein said first determination mark has a pattern receiving the same influence of aberration as that exerted by irradiation of light to said first semiconductor device component member, and said second determination mark has a pattern receiving the same influence of aberration as that exerted by irradiation of light to said second semiconductor device component member.

* * * * *